United States Patent [19]

Fryd et al.

[11] Patent Number: 4,551,522
[45] Date of Patent: Nov. 5, 1985

[54] PROCESS FOR MAKING PHOTOPOLYMERIZABLE AROMATIC POLYAMIC ACID DERIVATIVES

[75] Inventors: Michael Fryd, Haddonfield, N.J.; David L. Goff, Hockessin, Del.

[73] Assignee: E. I. Du Pont de Nemours and Company, Wilmington, Del.

[21] Appl. No.: 727,809

[22] Filed: Apr. 26, 1985

[51] Int. Cl.[4] ............................................. C08G 73/12
[52] U.S. Cl. ................................. 528/351; 204/159.11;
 528/26; 528/125; 528/126; 528/128; 528/172;
 528/179; 528/182; 528/185; 528/188; 528/206;
 528/207; 528/208; 528/220; 528/222; 528/224;
 528/226; 528/229; 528/352; 528/353
[58] Field of Search ............... 528/125, 126, 128, 172,
 528/179, 182, 26, 185, 188, 189, 220, 222, 224,
 226, 229, 206, 207, 208, 351, 352, 353;
 204/159.11

[56] References Cited

U.S. PATENT DOCUMENTS

| Re. 30,186 | 1/1980 | Rubner et al. | 204/159.19 |
|---|---|---|---|
| 4,316,845 | 2/1982 | D'Alelio et al. | 528/353 |
| 4,320,217 | 3/1982 | D'Alelio et al. | 528/353 |
| 4,416,973 | 11/1983 | Goff | 204/159.18 |
| 4,438,273 | 3/1984 | Landis | 528/128 |
| 4,447,596 | 5/1984 | Makino et al. | 528/125 |
| 4,485,231 | 11/1984 | Landis | 528/125 |
| 4,485,234 | 11/1984 | Makino et al. | 528/125 |
| 4,495,342 | 1/1985 | Landis | 528/125 |
| 4,496,711 | 1/1985 | Landis | 528/125 |

Primary Examiner—Lester L. Lee

[57] ABSTRACT

A process for the synthesis of the photosensitive polyamic acid derivatives which are polyimide precursors, comprising the sequential steps:
(1) Partially derivatizing an aromatic dianhydride with a reactive monomer containing a photosensitive moiety;
(2) Condensation polymerizing the partially derivatized aromatic dianhydride with aromatic diamine to form polyamic acid;
(3) Isoimidization of the polyamic acid;
(4) Condensation of the polyisoimide to polyamic acid derivative by reaction with additional reactive monomer; and
(5) Separation of the polyamic acid derivative.

1 Claim, No Drawings

PROCESS FOR MAKING PHOTOPOLYMERIZABLE AROMATIC POLYAMIC ACID DERIVATIVES

FIELD OF INVENTION

The invention is directed to an improved process for making aromatic polyamic acid derivatives which are photopolymerizable.

BACKGROUND OF THE INVENTION

Polyimides find extensive use in electronic applications where they are useful in forming dielectric films on electrical and electronic devices such as capacitors and semiconductors. Typical uses for polyimides include protective coatings for semiconductors, dielectric layers for multilayer integrated circuits, high temperature solder masks, bonding multilayer circuits, final passivating coatings on electronic devices and the like.

It is well known in the polymer art to make thermally stable all-aromatic polyimides by the condensation polymerization of dianhydrides and diamines to form polyamic acid. Such polyimide precursors are disclosed inter alia in U.S. Pat. No. 3,179,634 to Edwards. These polyamic acids are readily dehydrated to the corresponding polyimides by heating at high temperatures, e.g. 300° to 400° C. Solutions of such polyamic acids in aprotic solvents are then coated to form the polyimide.

In many electronic applications, it is advantageous to have such polyimide precursors which are photosensitive and thus can be used to form quite precise coating patterns upon the devices on which they are used. In such applications, a solution of the polyimide precursor is applied to a substrate such as a silicon wafer and dried to form a film on the substrate. The film is then exposed to radiation through a masking template (pattern) and photopolymerized. The unexposed and unpolymerized part of the film is dissolved off with a developer solution to form a relief structure. The resulting relief structure is baked to convert the photopolymerized material into a polyimide structure with a sharp definition and with good mechanical, chemical and electrical properties.

PRIOR ART

Such photopolymerizable polyimide precursors, which can be used in the above manner to form relief structures on electronic devices, are well known as shown in, for example, U.S. Pat. No. 3,953,877, issued Apr. 27, 1976 to Sigusch et al., U.S. Pat. No. 3,957,512, issued May 18, 1976 to Kleeburg, U.S. Pat. No. 4,040,831, issued Aug. 9, 1977 to Rubner et al. (now U.S. Pat. No. Re. 30,186, reissued Jan. 8, 1980), and more recently, U.S. Pat. No. 4,416,973, issued Nov. 22, 1983 to Goff.

Of particular interest are the photosensitive polyamic acid esters made by the methods of Kleeburg et al. in U.S. Pat. No. 3,957,512 and Rubner et al. in U.S. Pat. No. 4,040,831. Basically the process used in these patents involves the solution reaction of an aromatic dianhydride such as pyromellitic acid anhydride with a photosensitive monomer such as hydroxyethyl methacrylate (HEMA) to form the corresponding methacrylate ester of the tetracarboxylic acid. The half-esterified anhydride is then reacted with thionyl chloride to convert the acid groups to the acid chloride form. This intermediate is reacted with a diamine such as oxydianiline to form the corresponding polyamic acid derivative which is a precursor of the polyimide. This process can be seen easily in the following set of equations:

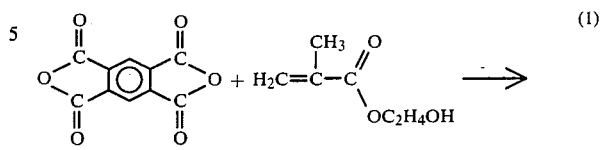

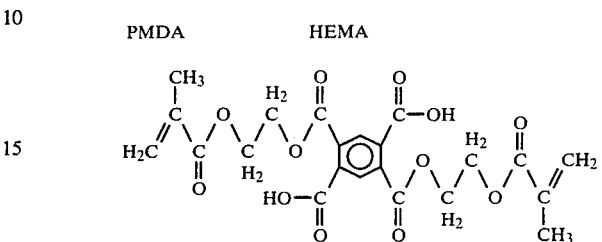

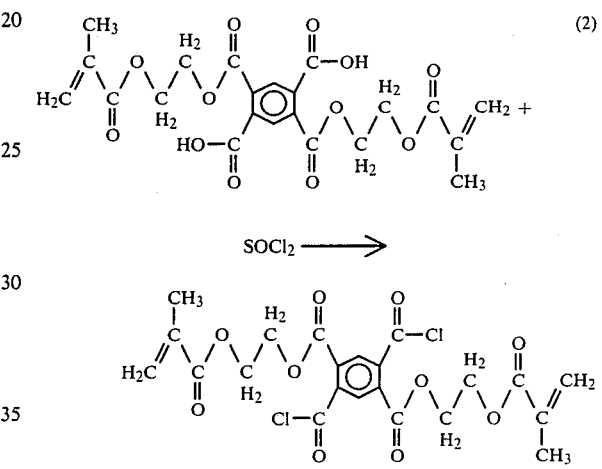

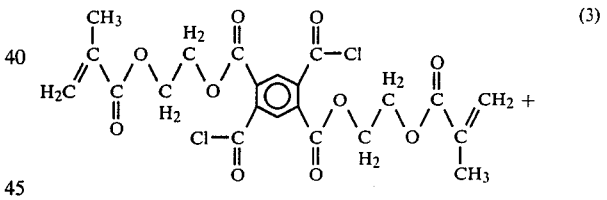

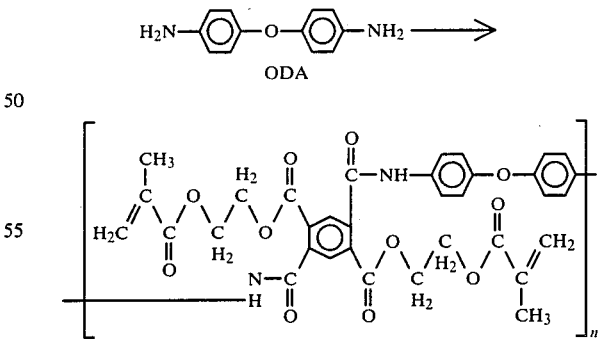

POLYAMIC ACID DERIVATIVE

Though the above-described process is an effective route for making photosensitive polyimide precursors, it has been found to have several practical disadvantages. Firstly, it has been found by size exclusion chromatography that the molecular weight distribution of the polymer produced in step (3) is broad (d = 3.85).

Secondly, low reaction temperatures (−20° C.) are required to avoid undesirable side reactions in step (2). Thirdly, step (2) introduces chloride ions into the system which must be removed by ion exchange techniques to prevent corrosion of the metal circuits with which the polymer is frequently used. Fourthly, the large number of reaction and treating steps coupled with a long cycle time make the process difficult to carry out reproducibly, especially on a commercial scale. Because of these substantial disadvantages, it would be quite desirable to have a process for making such photosensitive polyimide precursors in which molecular weight distribution is controlled more closely and it would be unnecessary to introduce chloride or any other ions which then have to be removed from the system.

SUMMARY OF THE INVENTION

The invention is therefore directed to an improved process for the synthesis of photosensitive polyamic acid derivatives which are polyimide precursors comprising the sequential steps:

(1) forming a solution in aprotic solvent of aromatic dianhydride and monomer(s) corresponding to the formula RZH, wherein R is an ethylenically unsaturated moiety capable of addition polymerization and Z is —O—, —S— or —NR'— wherein R' is —H or $C_{1-4}$ alkyl, the amount of monomer being 0-40 equivalent %, basis dianhydride, and maintaining the solution for a time and temperature sufficient to effect partial reaction of the aromatic dianhydride with substantially all of the monomer;

(2) admixing with and dissolving in the aromatic dianhydride-containing reaction solution of step (1) aromatic diamine while maintaining the reaction solution below 50° C. to effect condensation polymerization of the unreacted anhydride and amine moieties to form the corresponding polyamic acid(s);

(3) admixing with and dissolving in the polyamic acid(s)-containing reaction solution of step (2) an isoimidization agent selected from the group consisting of N,N'-dihydrocarbyl-substituted carbodiimides and trifluoroacetic acid anhydride to convert the polyamic acid(s) to the corresponding polyisoimide(s);

(4) admixing with and dissolving in an aprotic solution of the polyisoimide(s) of step (3) a molar excess of monomer corresponding to the formula RZH and maintaining the solution for a time and temperature sufficient to effect esterification of the polyisoimide(s) with monomer and converting the polyisoimide(s) to the corresponding polyamic acid derivative(s); and (5) separation of polyamic acid derivative(s) from the reaction solution of step (4).

DETAILED DESCRIPTION OF THE INVENTION

The process of the invention can be summarized in detail by the following sequence of equations:

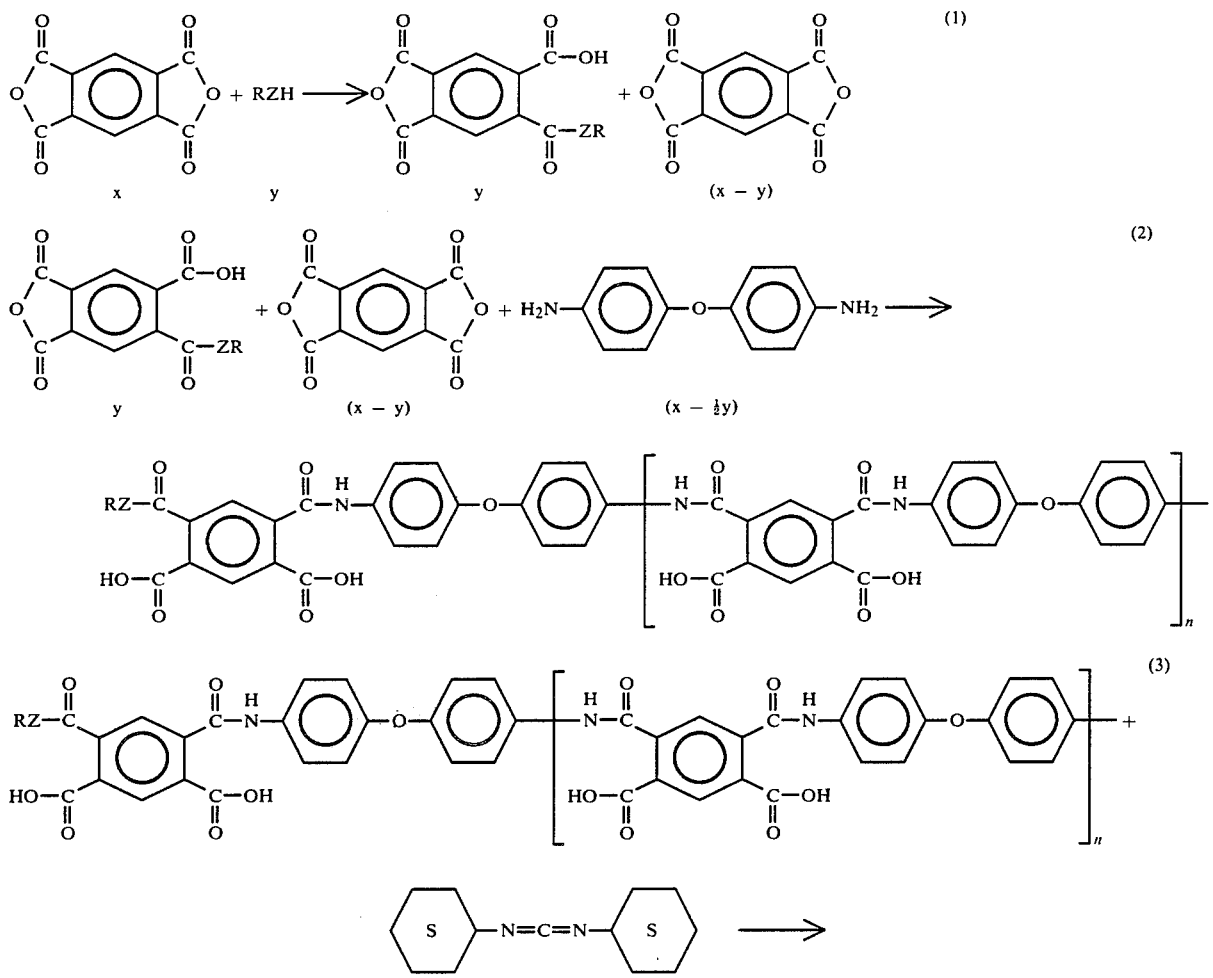

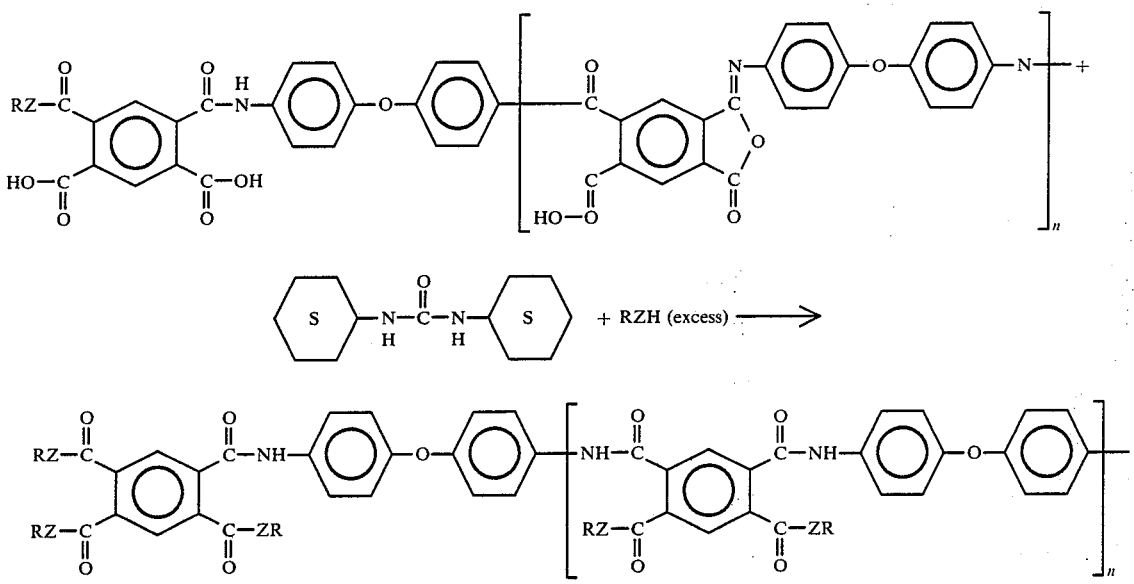

The first step of the process of the invention is directed to introducing a minor proportion of the photosensitive moieties into dianhydride reactant, thereby "end capping" part, but not all, of the dianhydride reactant. This reaction is readily accomplished by dissolving the dianhydride in an appropriate aprotic solvent such as N-methylpyrrolidone, adding the monomer to the solution and then heating the solution.

This partial conversion step, though optional, is very important in that it helps to control the molecular weight of the polycondensation product formed later in the process by the dianhydride-diamine reaction. In particular, it has been found that a higher degree of conversion, e.g., 25-40%, produces low molecular weight polymers. From 15 to 25% conversion is preferred to make oligomeric polymers. On the other hand, a lower degree of conversion, e.g., 3-15% results in a polymer having too high a molecular weight. From this, it can be seen that by careful control of the degree of conversion in the first step of the process, more precise control over the molecular weight can be achieved. The reaction is relatively fast and is usually completed within two hours.

The aprotic solvent for the preliminary reaction or conversion step is chosen to be consistent with the later polycondensation reaction so that solvent segregation does not become necessary at any point during the process. Suitable solvents are: N-methylpyrrolidone, dimethyl acetamide, dimethyl sulfoxide and dimethyl formamide. N-methylpyrrolidone is a particularly preferred solvent for use in the invention. Mixtures of the solvents can be used as well to adjust the volatility of the solvent medium. The solvent should, however, be substantially free of water to avoid the formation of reaction by-products with the dianhydride reactants. Solvents having a water content of no more than 0.1% wt. are preferred.

As indicated above, suitable monomers for conversion of the anhydride and, later in the process, conversion of the partially derivatized polyisoimide to the fully derivatized polyamic acid are those corresponding to the formula RZH, wherein R is an ethylenically unsaturated moiety capable of addition polymerization which can be described by the following formulas.

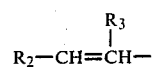

or

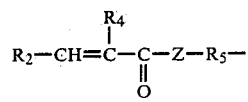

wherein
R₂ is hydrogen, $C_1$-$C_{18}$ alkyl, $C_6$-$C_{18}$ aryl or aralkyl,
R₃ is $C_1$-$C_{12}$ alkyl, $C_6$-$C_{18}$ aryl or aralkyl,
R₄ is hydrogen or methyl,
R₅ is $C_2$-$C_6$ oxy, thio or aminoalkyl, and wherein
Z is —O—, —S— or —NR¹—,
wherein R¹ is —H or $C_{1-4}$ alkyl.

Terminally unsaturated ($\alpha,\beta$-unsaturated) monomers are preferred, of which the acrylic and methacrylic acid monoesters of aliphatic diols having from 1 to 12 carbon atoms are preferred. Suitable monomers include hydroxyaklkyl esters of acrylic and methacrylic acids such as hydroxyethyl acrylate and methacrylate, hydroxypropyl acrylate and methacrylate, hydroxybutyl acrylate and methacrylate, hydroxystearyl acrylate and methacrylate.

Also suitable are the mono-$C_{1-4}$ alkylsubstituted $C_{2-4}$ alkyl amines of acrylic and methacrylic acid such as N-tert-butylaminopropyl acrylate and N-tert-butylaminopropyl methacrylate.

Suitable dianhydrides for the process of the invention are aromatic tetracarboxylic acid dianhydrides as described below:

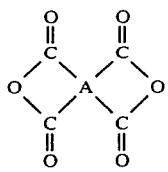

wherein A is a tetravalent aromatic radical, e.g.

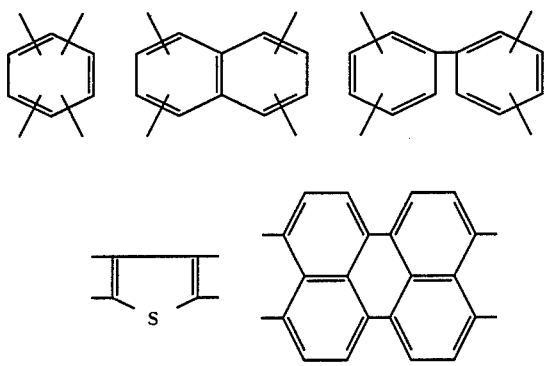

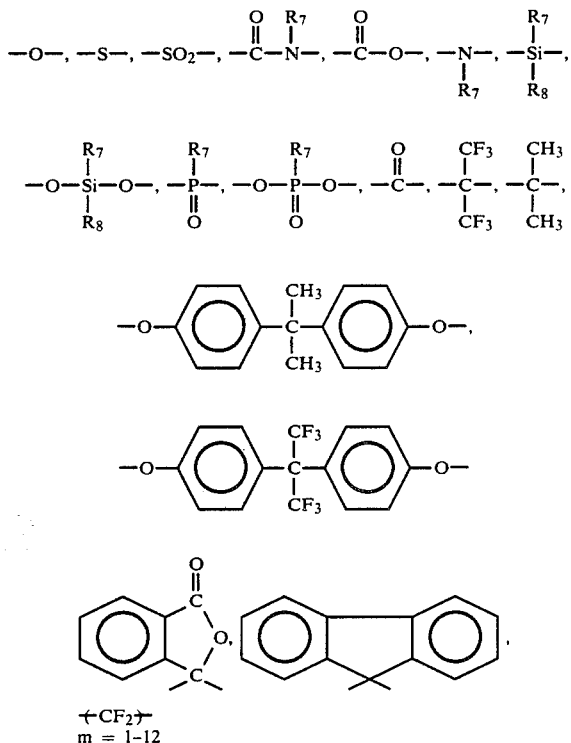

wherein $R^6$ is selected from the group consisting of $-O-$, $-S-$, $-SO_2-$, $-\overset{\overset{O}{\|}}{C}-\overset{\overset{R_7}{|}}{N}-$, $-\overset{\overset{O}{\|}}{C}-O-$, $-\overset{\overset{|}{N}}{\underset{|}{R_7}}-$, $-\overset{\overset{R_7}{|}}{\underset{|}{Si}}-$, $-O-\overset{\overset{R_7}{|}}{\underset{\underset{R_8}{|}}{Si}}-O-$, $-\overset{\overset{R_7}{|}}{\underset{\underset{O}{\|}}{P}}-$, $-O-\overset{\overset{R_7}{|}}{\underset{\underset{O}{\|}}{P}}-O-$, $-\overset{\overset{O}{\|}}{C}-$, $-\overset{\overset{CF_3}{|}}{\underset{\underset{CF_3}{|}}{C}}-$, $-\overset{\overset{CH_3}{|}}{\underset{\underset{CH_3}{|}}{C}}-$,

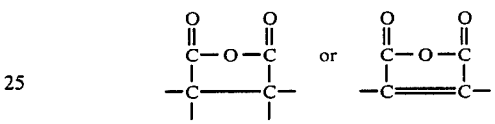

-(CF$_2$)-
m = 1-12

-continued

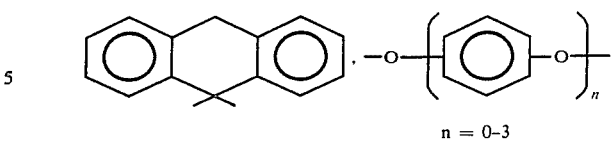

n = 0-3

$R_7$ and $R_8$ are alkyl or aryl and substituted groups thereof.

In these dianhydrides, every carbonyl group is attached directly to a different carbon atom of the aromatic radical, the carbonyl groups being in pairs, the groups of each pair being adjacent to each other. Adjacent means ortho or peri so that the dicarbonyl anhydride rings are 5- or 6-membered, respectively.

The preferred aromatic dianhydrides are those in which the carbon atoms of each pair of carbonyl groups are directly attached to ortho carbon atoms in the A group to provide a 5-membered ring as follows:

$$\begin{matrix} O & & O \\ \| & & \| \\ -C-O-C- \\ | & & | \\ -C & & C- \\ | & & | \end{matrix} \quad \text{or} \quad \begin{matrix} O & & O \\ \| & & \| \\ -C-O-C- \\ | & & | \\ -C & = & C- \end{matrix}$$

Illustrations of dianhydrides suitable for use in the present invention include:
Pyromellitic dianhydride;
2,3,6,7-naphthalene tetracarboxylic dianhydride;
3,3',4,4'-diphenyl tetracarboxylic dianhydride;
1,2,5,6-naphthalene tetracarboxylic dianhydride;
2,2',3,3'-diphenyl tetracarboxylic dianhydride;
2,2-bis(3,4-dicarboxyphenyl)propane dianhydride;
Bis(3,4-dicarboxyphenyl) sulfone dianhydride;
3,4,9,10-perylene tetracarboxylic dianhydride;
Bis(3,4-dicarboxyphenyl) ether dianhydride;
Naphthalene-1,2,4,5-tetracarboxylic dianhydride;
Naphthalene-1,4,5,8-tetracarboxylic dianhydride;
2,6-dichloronaphthalene-1,4,5,8-tetracarboxylic dianhydride;
2,7-dichloronaphthalene-1,4,5,8-tetracarboxylic dianhydride;
2,3,6,7-tetrachloronaphathene-1,4,5,8-tetracarboxylic dianhydride;
Phenanthrene 1,8,9,10-tetracarboxylic dianhydride;
2,2-bis(3,4-dicarboxyphenyl)hexafluoropropane dianhydride;
2,2-bis(2,3-dicarboxyphenyl) propane dianhydride;
1,1-bis(2,3-dicarboxyphenyl) ethane dianhydride;
1,1-bis(3,4-dicarboxyphenyl) ethane dianhydride;
Bis(2,3-dicarboxyphenyl) methane dianhydride;
Bis(3,4-dicarboxyphenyl) methane dianhydride;
Bis(3,4-dicarboxyphenyl) sulfone dianhydride;
Benzene-1,2,3,4-tetracarboxylic dianhydride;
3,4,3',4'-benzophenone tetracarboxylic dianhydride;
2,3,2',3'-benzophenone tetracarboxylic dianhydride;
2,3,3',4'-benzophenone tetracarboxylic dianhydride;
Pyrazine-2,3,4,6-tetracarboxylic dianhydride;
Thiophene-2,3,4,5-tetracarboxylic dianhydride; etc.

Following the partial esterification of the aromatic dianhydride, soluble aromatic diamine is added directly to the reaction solution from the previous step to effect polycondensation of the partially esterified dianhydrides with diamine. Suitable organic diamines are those corresponding to the following formulae:

H₂N—B—NH₂ wherein B is a divalent aromatic radical (arylene) selected from the following groups: phenylene, naphthalene, biphenylene, anthrylene, furylene, benzfurylene and

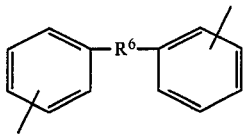

wherein R⁶ is selected from the group consisting of an alkylene chain having 1-3 carbon atoms.

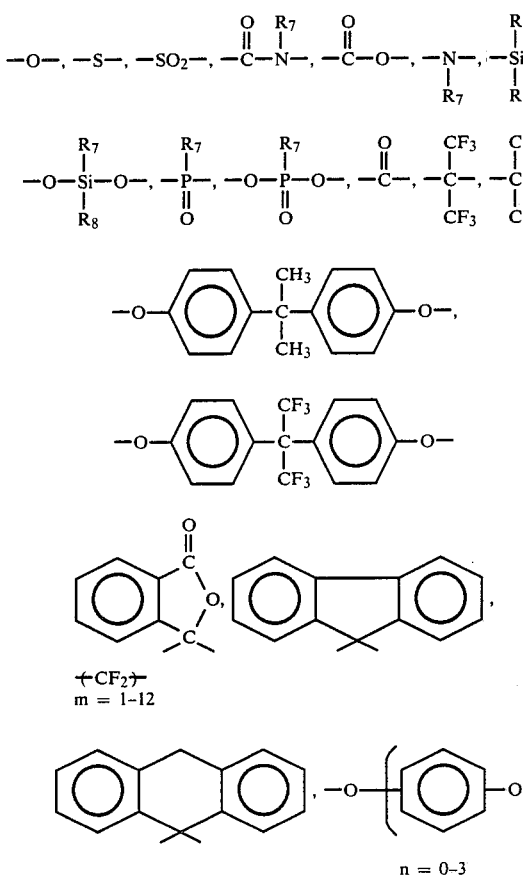

n = 0-3 wherein $R^7$ and $R^8$ are alkyl or aryl, and substituted groups thereof. Among the diamines which are suitable for use in the present invention are:

Meta-phenylene diamine;
Para-phenylene diamine;
2,2-bis(4-amino-phenyl)propane;
4,4'-diamino-diphenyl methane;
4,4'-diamino-diphenyl sulfide;
4,4'-diamino-diphenyl sulfone;
3,3'-diamino-diphenyl sulfone;
4,4'-diamino-diphenyl ether;
2,6-diamino-pyridine;
Bis-(4-amino-phenyl) diethyl silane;
Bis-(4-amino-phenyl) diphenyl silane;
Benzidine;
3,3'-dichloro-benzidine;
3,3'-dimethoxy benzidine
2,2-(4-aminophenyl)hexafluoropropane
Bis-(4-amino-phenyl) ethyl phosphine oxide;
Bis-(4-amino-phenyl) phenyl phosphine oxide;
Bis-(4-amino-phenyl)-N-butylamine;
Bis-(4-amino-phenyl)-N-methylamine; 1,5-diaminonaphthalene;
3,3'-dimethyl-4,4'-diaminobiphenyl;
N-(3-amino-phenyl)-4-aminobenzamide;
4-amino-phenyl-3-aminobenzoate;
and mixtures thereof.

The inclusion of one or more diamines or dianhydrides other than those disclosed, e.g., aliphatic diamines or aliphatic dianhydrides, as reactants in the process may detract from one or more desirable properties of the polymeric products. However, the inclusion of such materials, to the extent that they do not detract substantially from the desirable results obtained with the aromatic reactants, is contemplated.

Upon admixing the reactants, the formation of polyamic acid by polycondensation reaction of the dianhydrides and diamines takes place quite readily at room temperature. Because the reaction is exothermic, the temperature of any batch reaction system tends to be raised substantially. For this reason, it is normal practice to form a solution of one of the reactants in the solvent and then slowly add the other reactant to the solution in order to control the temperature of the reaction.

It will ordinarily be preferred that approximately equimolar proportions of the reactants be used in the reaction system in order that adequate polymer molecular weight can be obtained. For this reason, neither the nonderivatized dianhydride/diamine ratio nor the diamine/nonderivatized dianhydride ratio should be less than 0.95.

On the other hand, the concentration of the reactants in the solvent is not narrowly critical. Polymer solutions with concentrations as much as 40% wt. solids can be prepared. However, it is preferable to use solutions with 10-20% wt. solids.

In the third step of the process of the invention, the addition of an isoimidization agent performs two functions: (1) the polyamic acids formed in the previous step are dehydrated and (2) cyclized to form the isoimide form of the polymer. The isoimidization agent can be either trifluoroacetic acid anhydride (TFAA) or N,N'-dihydrocarbyl-substituted carbodiimide (DCC). The isoimidization agent is preferably added as a solution in aprotic solvent, usually but not necesssarily the same one which was used in the previous steps of the process. When a carbodiimide is used as the isoimidization agent, it is preferred that it be added in molar excess of the amount needed to isoimidize all of the partially derivatized polyamic acid. A mole ratio of 1.0 is essential and 1.2-1.5 is preferred. With trifluoroacetic anhydride, it is preferable to use somewhat less than an equimolar amount of the isoimidization agent, a mole ratio of 0.85-0.95 being preferred.

The isoimidization agents produce by-products which do not interfere with the succeeding reactions. When carbodiimides are used as the isoimidization agent, they are converted to insoluble disubstituted urea. It may be removed by filtration, but it is not necessary to do so since it does not in any way interfere with the succeeding esterification step. On the other hand, when trifluoroacetic acid anhydride (TFAA) is used in this step, it is converted to trifluoroacetic acid, which is soluble.

Both types of isoimidization agents produce a significant exotherm in the isoimidization reaction. However, this can readily be controlled by adjusting the rate at which the agent is added to the reaction system.

Following conversion of the partially derivatized polyamic acid to the isoimide form, the isoimide is then reacted with monomer HZR to effect conversion of the polyisoimide to the polyamic acid derivative. However, excess monomer, heat and/or catalyst can be used to reduce reaction time. Usually a molar ratio of monomer is isoimide of at least 3 is preferred and, preferably still, 4 or 5 with a reaction time of 5 hours at 55° C. While the above-described steps were carried out sequentially, they can be combined and carried out simultaneously as well when using DCC.

The polyamic acid derivative is separated from the reaction solution by methods well known in the polymer art. For example, the final reaction solution can be filtered to remove any solids which may be present (e.g., N,N'-dicyclohexyl urea produced in the second step). Then the solution is added with stirring to a 5-7-fold excess of deionized water, which results in separation of the solid polyamic acid derivative as a colored yellow solid. This solid can in turn be filtered out and then vacuum dried.

The invention can be better understood by reference to the following examples.

EXAMPLES

Example 1

To a stirred solution of 15.24 g (0.070 mol) of pyromellitic dianhydride in 155 mL of dry N-methylpyrrolidone under a blanket of dry air was added 3.64 g (0.028 mol) of 2-hydroxyethyl methacrylate. The solution was stirred at room temperature for 1 hour and at 35° C. for 1 hour and cooled to room temperature. A solution of 11.20 g (0.056 mol) of oxydianiline in 20 mL of dry N-methylpyrrolidone was added dropwise to the stirred solution over a 1-hour period and the reaction was stirred at room temperature overnight.

A solution of 30.00 g (0.145 mol) of N,N-dicyclohexyl carbodiimide in 60 mL of dry N-methylpyrrolidone was added over a 15-minute period to the stirred reaction. During this time the color of the solution intensified and precipitation of N,N-dicyclohexyl urea was observed. The suspension was stirred overnight at room temperature. The infrared absorption spectrum of the reaction mixture displayed bands at 1810 and 910 cm$^{-1}$ characteristic of the isoimide structure.

46.0 g of 2-hydroxyethyl methacrylate was added and the reaction was stirred at 50° C. for 5 hours and at room temperature overnight. Examination of the infrared spectrum for this material confirmed that the isoimide units were converted to amide ester units. The reaction mixture was diluted with 40 mL of acetone and suction filtered to remove N,N-dicyclohexyl urea. The filtrate was treated with 1.0 L of deionized water accompanied by vigorous agitation to provide the polyamic ester as a dark yellow solid. The solid was washed with additional deionized water followed by methanol and suction dried on the filter. The resulting filter cake was vacuum dried at room temperature to constant weight and contained <1.0% water by weight.

Example 2

To a stirred solution of 36.10 g (0.166 mol) of pyromellitic dianhydride in 360 ml of dry N-methyl pyrrolidone under a blanket of dry air was added 8.62 g (0.066 mol) of 2-hydroxyethyl methacrylate followed by a rinse with 15 mL of dry N-methylpyrrolidone. The solution was stirred at room temperature for 1 hour and at 35° C. for 1 hour and cooled to room temperature. A solution of 26.50 g (0.132 mol) of oxydianiline in 60 mL of dry N-methylpyrrolidone was added dropwise to the stirred solution over a 1-hour period, and the reaction was stirred at room temperature overnight.

110.00 g of 2-hydroxyethyl methacrylate was added and the reaction was stirred for 15 minutes before adding a solution of 70.50 g (0.342 mol) of N,N-dicyclohexyl carbodiimide in 145 mL of dry N-methylpyrrolidone dropwise over a 30-minute period. During this time, the precipitation of N,N-dicyclohexyl urea began to occur. The reaction was stirred at room temperature for 40 hours and diluted with 200 mL of acetone before filtration to remove the N,N-dicyclohexyl urea. The filtrate was added to 15 L of deionized water accompanied by vigorous agitation to provide the polyamic ester as a yellow solid. This solid was washed with additional deionized water followed by methanol and vacuum filtered. The resulting filter cake was vacuum dried at 45° C. to constant weight and contained ≦1.0% water by weight.

EXAMPLE 3

To a stirred solution of 31.08 g (0.070 moles) of 2,2 hexafluoropropane diphthalic anhydride in 155 mL of dry N-methylpyrrolidone, under a blanket of dry nitrogen was added 1.22 g (0.021 moles) of allyl alcohol. The solution was stirred at 50° C. for 2 hours and cooled to room temperature. A solution of 11.9 g (0.06 moles) of oxydianiline in 70 g of dry N-methylpyrrolidone was added dropwise to the stirred solution over a 1-hour period and the reaction was stirred at room temperature overnight.

A solution of 30 g (0.145 moles) of N,N-dicyclohexyl carbodiimide in 70 mL of N-methylpyrrolidone was added over a 15-minute period to the stirred reaction. During this time, the color of the reaction intensifies and the precipitation of N,N-dicyclohexyl urea was observed. The suspension was stirred overnight at room temperature. The infrared absorption spectrum displayed bands at 1810 and 910 cm$^{-1}$ which are characteristic of the isoimide structure. 20.7 g of allyl alcohol were added to the reaction mixture and stirred at 50° C. for 5 hours and at room temperature overnight. Examination of the infrared spectrum confirmed that the isoimide units were converted to amide ester units. The reaction mixture was diluted with 40 mL of acetone and suction filtered to remove N,N-dicyclohexyl urea. The filtrate was treated with 1.0 L of deionized water accompanied by vigorous agitation to provide the polyamic ester as a light tan solid. The solid was washed with additional deionized water, followed by methanol, and suction dried on the filter. The resulting cake was vacuum dried at room temperature to constant weight and contained less than 1% water by weight.

EXAMPLE 4

To a stirred solution of 22.54 g (0.070 moles) of benzophenone tetracarboxylic dianhydride in 155 mL of N-methylpyrrolidone under a blanket of dry nitrogen was added 2.60 g (0.020 moles) of 2-hydroxyethyl methacrylate. The solution was stirred at 50° C. for 2 hours and cooled to room temperature. A solution of 5.95 g (0.03 moles) of oxydianiline and 3.22 (0.03 moles) of m-phenylene diamine in 70 g of dry N-methylpyrrolidone was added dropwise to the stirred solution over a 1-hour period, and the reaction was stirred at room temperature overnight.

The above reaction mixture was diluted with 250 mL of dry N-methylpyrrolidone and added dropwise to a stirred solution of 42 g (0.2 moles) of trifluoroacetic anhydride in 1 L of dry diethyl ether over a 2-hour period. This resulted in the precipitation of polyisoimide fibrils which were filtered with suction and washed with dry diethyl ether. The suction dried filter cake was redissolved in 250 mL of dry N-methylpyrrolidone and to this solution was added 46.0 g of 2-hydroxyethyl methacrylate. The reaction mixture was stirred at 50° C. for 5 hours and at room temperature overnight. Examination of the infrared spectrum confirmed that the isoimide units were converted to amide ester units. The reaction mixture was treated with 1.0 L of deionized water accompanied by vigorous agitation to provide the polyamic ester as a tan solid. The solid was treated with additional deionized water followed by methanol and suction dried on the filter. The resulting filter cake was vacuum dried at room temperature to constant weight and contained <1° water by weight.

We claim:

1. A process for the synthesis of photosensitive polyamicacid derivatives which are polyimide precursors comprising the sequential steps:

(1) forming a solution in aprotic solvent of aromatic dianhydride and monomer(s) corresponding to the formula RZH, wherein R is an ethylenically unsaturated moiety capable of addition polymerization and Z is —O—, —S— or —NR'— wherein R' is —H or $C_{1-4}$ alkyl, the amount of monomer being 0-40 equivalent %, basis dianhydride, and maintaining the solution for a time and temperature sufficient to effect partial reaction of the aromatic dianhydride with substantially all of the monomer;

(2) admixing with and dissolving in the aromatic dianhydride-containing reaction solution of step (1) aromatic diamine while maintaining the reaction solution below 50° C. to effect condensation polymerization of the unreacted anhydride and the amine moieties to form the corresponding polyamic acid(s);

(3) admixing with and dissolving in the polyamic acid(s)-containing reaction solution of step (2) an isoimidization agent selected from the group consisting of N,N'-dihydrocarbyl-substituted carbodiimides, trifluoroacetic acid anhydride and mixtures thereof to convert the polyamic acid(s) to the corresponding polyisoimide(s);

(4) admixing with and dissolving in an aprotic solution of the polyisoimide(s) of step (3) a molar excess of monomer corresponding to the formula RZH and maintaining the solution for a time and temperature sufficient to effect substantially complete esterification of the carboxylic acid moieties of the polyisoimide(s) with monomer and converting the polyisoimide(s) to the corresponding polyamic acid derivatives; and (5) separation of polyamic acid derivatives from the reaction solution of step (4).

* * * * *